(12) United States Patent  
Briggs et al.

(10) Patent No.: US 10,586,767 B2  
(45) Date of Patent: Mar. 10, 2020

(54) HYBRID BEOL METALLIZATION UTILIZING SELECTIVE REFLECTION MASK

(71) Applicant: International Business Machines Corporation, Armonk, NY (US)

(72) Inventors: Benjamin D. Briggs, Waterford, NY (US); Cornelius Brown Peethala, Slingerlands, NY (US); Michael Rizzolo, Albany, NY (US); Koichi Motoyama, Clifton Park, NY (US); Gen Tsutsui, Glenmont, NY (US); Ruqiang Bao, Niskayuna, NY (US); Gangadhara Raja Muthinti, Albany, NY (US); Lawrence A. Clevenger, Rhinebeck, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/039,570

(22) Filed: Jul. 19, 2018

(65) Prior Publication Data

US 2020/0027840 A1    Jan. 23, 2020

(51) Int. Cl.
*H01L 23/532* (2006.01)
*H01L 21/02* (2006.01)
(Continued)

(52) U.S. Cl.
CPC .... *H01L 23/53238* (2013.01); *H01L 21/0254* (2013.01); *H01L 21/30604* (2013.01);
(Continued)

(58) Field of Classification Search
CPC ........... H01L 23/53238; H01L 21/0254; H01L 21/30604; H01L 21/4853; H01L 21/76825; H01L 21/76897
See application file for complete search history.

(56) References Cited

U.S. PATENT DOCUMENTS 9,536,830 B2   1/2017  Bao et al.
9,793,206 B1  10/2017  Briggs et al.
(Continued)

OTHER PUBLICATIONS

Amanapu et al., "Method for dual metallization in a single level", IBM Disclosure Sep. 6, 2016.
(Continued)

*Primary Examiner* — Zandra V Smith
*Assistant Examiner* — Andre C Stevenson
(74) *Attorney, Agent, or Firm* — Fleit Intellectual Property Law; Donna Flores

(57) ABSTRACT

A method for fabricating semiconductor wafers comprises creating a semiconductor wafer having a plurality of wide copper wires and a plurality of narrow copper wires embedded in a dielectric insulator. The width of each wide copper wire is greater than a cutoff value and each narrow copper is less than the cutoff value. An optical pass through layer is deposited over a top surface of the wafer and a photo-resist layer is deposited over the optical pass through layer. The wafer is exposed to a light source to selectively remove photo-resist, forming a self-aligned pattern where photo-resist only remains in areas above wide copper wires. The self-aligned pattern is transferred to the optical pass through layer and the remaining photo-resist is removed. The wafer is chemically etched to remove the narrow copper wires, defining narrow gaps in the dielectric insulator. The wafer is metallized with non-copper metal, forming narrow non-copper metal wires.

20 Claims, 6 Drawing Sheets

(51) Int. Cl.
*H01L 21/48* (2006.01)
*H01L 21/768* (2006.01)
*H01L 21/306* (2006.01)

(52) U.S. Cl.
CPC .... *H01L 21/4853* (2013.01); *H01L 21/76825* (2013.01); *H01L 21/76897* (2013.01)

(56) References Cited

U.S. PATENT DOCUMENTS

| | | |
|---|---|---|
| 2009/0053890 A1 | 2/2009 | Bonilla et al. |
| 2014/0175650 A1* | 6/2014 | Singh .................. H01L 23/5283 257/751 |
| 2014/0284801 A1 | 9/2014 | Kitamura et al. |
| 2014/0319685 A1 | 10/2014 | Bao et al. |
| 2014/0332924 A1 | 11/2014 | Bao et al. |
| 2014/0332963 A1 | 11/2014 | Filippi et al. |
| 2016/0071791 A1 | 3/2016 | Huang et al. |
| 2018/0090372 A1* | 3/2018 | Briggs ................ H01L 23/5226 |

OTHER PUBLICATIONS

Anonymous, "Hybrid refractory metal-copper wiring metalization scheme for integrated circuits", IPCOM000223293D Nov. 15, 2012.

* cited by examiner

HYBRID BEOL METALLIZATION UTILIZING SELECTIVE REFLECTION MASK

BACKGROUND

Field of Invention

The present disclosure generally relates to semiconductor manufacturing, and more particularly relates to a structure and method of fabrication for a hybrid back end of line (BEOL) metallization using a selective reflection mask.

Description of the Related Art

As wire dimensions shrink in semiconductor manufacturing, the resistance of such wire increases exponentially. At small widths, the resistance may become exceedingly high for the intended purpose. Most metallization used in semiconductor products today is copper (Cu). However, filling narrow features (i.e. <20 nm) with Cu, particularly at the same time as filling wider features (i.e. 20-100+ nm), can be very challenging.

Other non-Cu metals, such as cobalt (Co), ruthenium (Ru), etc., have better scaling for small dimensions. However, these metals result in a large resistance degradation for wide lines on an integrated circuit chip.

Today, most semiconductor products use only Cu or Co across an entire wafer. There are existing solutions to separately fill narrow and wide lines, but these solutions require additional masks for each metal layer, significantly increasing cost and manufacturing time and presenting overlay issues.

BRIEF SUMMARY

In one embodiment, a method for fabricating semiconductor wafers is disclosed. The method comprises creating a semiconductor wafer having a plurality of wide copper wires and a plurality of narrow copper wires embedded in a dielectric insulator. The width of each wide copper wire is greater than a cutoff value and each narrow copper is less than the cutoff value. An optical pass through layer is deposited over a top surface of the wafer and a photo-resist layer is deposited over the optical pass through layer. The wafer is exposed to a light source to selectively remove photo-resist, forming a self-aligned pattern where photo-resist only remains in areas above wide copper wires. The self-aligned pattern is transferred to the optical pass through layer and the remaining photo-resist is removed. The wafer is chemically etched to remove the narrow copper wires, defining narrow gaps in the dielectric insulator. The wafer is metallized with non-copper metal, forming narrow non-copper metal wires.

In another embodiment, another method for fabricating semiconductor wafers is disclosed. The method comprises creating a semiconductor wafer having a plurality of wide non-copper metal wires and a plurality of narrow non-copper metal wires embedded in a dielectric insulator. The width of each wide non-copper metal wire is greater than a cutoff value and each narrow non-copper metal is less than the cutoff value. An optical pass through layer is deposited over a top surface of the wafer and a photo-resist layer is deposited over the optical pass through layer. The wafer is exposed to a light source to selectively remove photo-resist, forming a self-aligned pattern where photo-resist only remains in areas above narrow non-copper metal wires. The self-aligned pattern is transferred to the optical pass through layer and the remaining photo-resist is removed. The wafer is chemically etched to remove the wide non-copper metal wires, defining wide gaps in the dielectric insulator. The wafer is metallized with copper metal, forming wide copper metal wires.

BRIEF DESCRIPTION OF THE SEVERAL VIEWS OF THE DRAWINGS

The accompanying figures, where like reference numerals refer to identical or functionally similar elements throughout the separate views, and which together with the detailed description below are incorporated in and form part of the specification, serve to further illustrate various embodiments and to explain various principles and advantages all in accordance with the present disclosure, in which.

DETAILED DESCRIPTION

Figure 1:
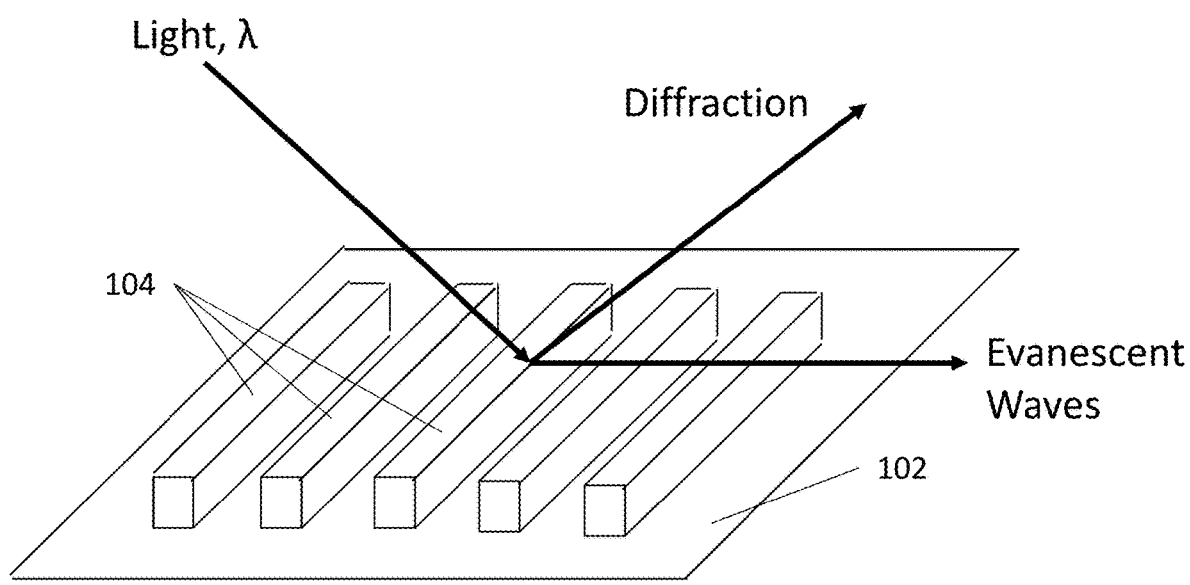
FIG. 1 is an illustration of a prior art example of a light diffracting on the surface of a semiconductor.

In this disclosure, a new method of manufacturing semiconductor wafers is provided which allows for copper and non-copper metallization to be used in the same wafer. As shown in FIG. 1, incident wavelength and intensity of light may be modulated to produce evanescent waves on the surface of the semiconductor 102, thereby selectively exposing resist 104 for a given pitch. For light having a wavelength ($\lambda$) greater than the pitch (P), which is typically the case, there are no higher diffraction orders (only specular) backscattered from the metal fill generating evanescent waves on the surface exposing the resist. However, for light where $\lambda<P$, non-zero diffraction orders are scattered from the surface and can be modulated to expose the resist by varying the intensity of light and metal/liner fill. This property is utilized in an embodiment of this invention to selectively expose the resist depending upon the width (i.e. pitch) of the metallized tracks.

Figure 2:
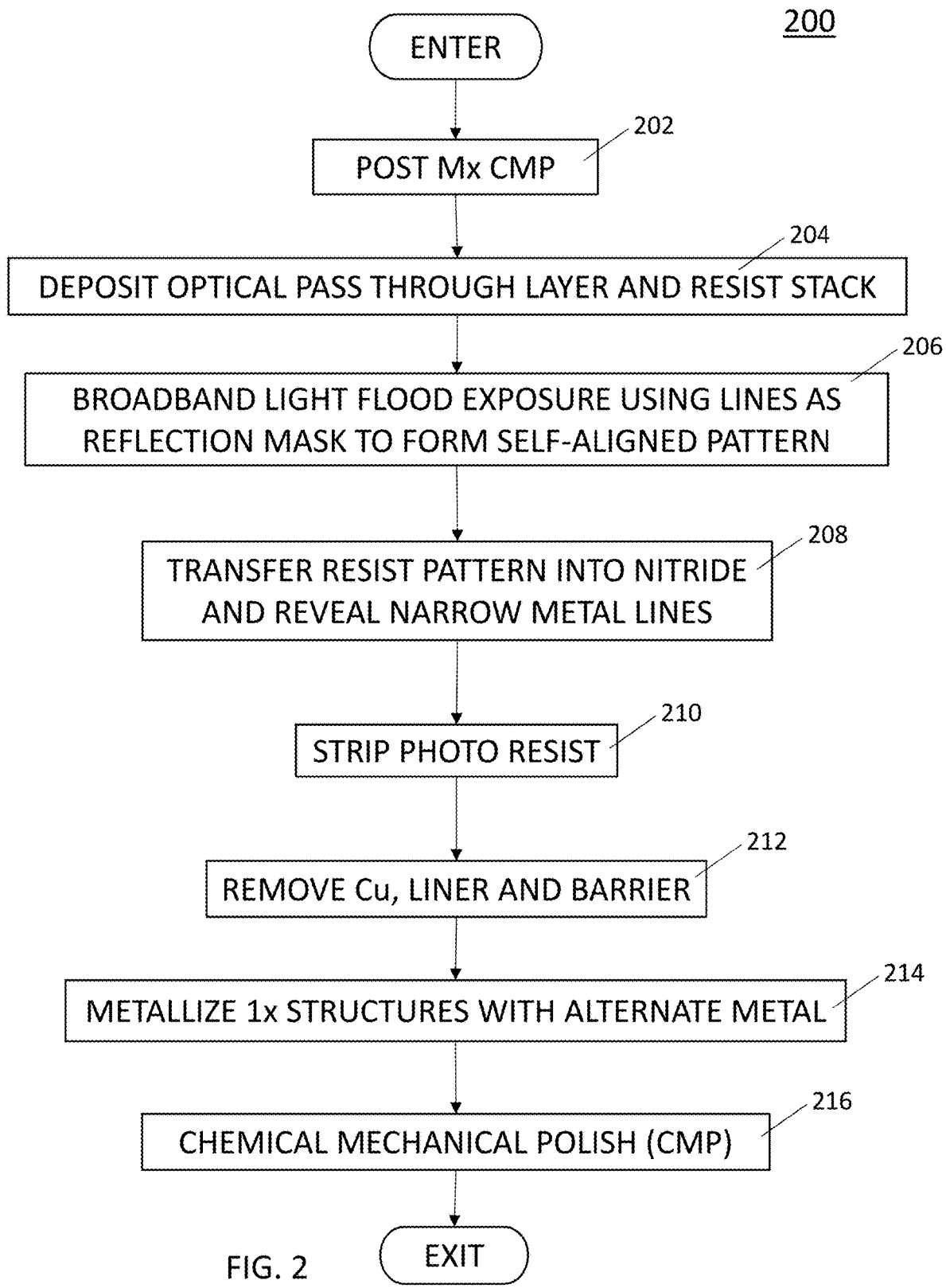
FIG. 2 is an operational flow diagram illustrating a process for manufacturing a semiconductor wafer using a hybrid BEOL metallization process that utilizes a selective reflection mask according to one embodiment of the present invention.

Turning now to FIG. 2, an operational flowchart 200 is provided which illustrates a process for manufacturing a semiconductor wafer using a hybrid BEOL metallization process that utilizes a selective reflection mask according to one embodiment of the present invention. FIGS. 3-5 and 7-10 are cross-sectional illustrations showing the status of the wafer at each step of the procedure. It should be noted that the drawings in FIGS. 3-5 and 7-10 are not to scale and are shown for illustrative purposes only.

Figure 3:
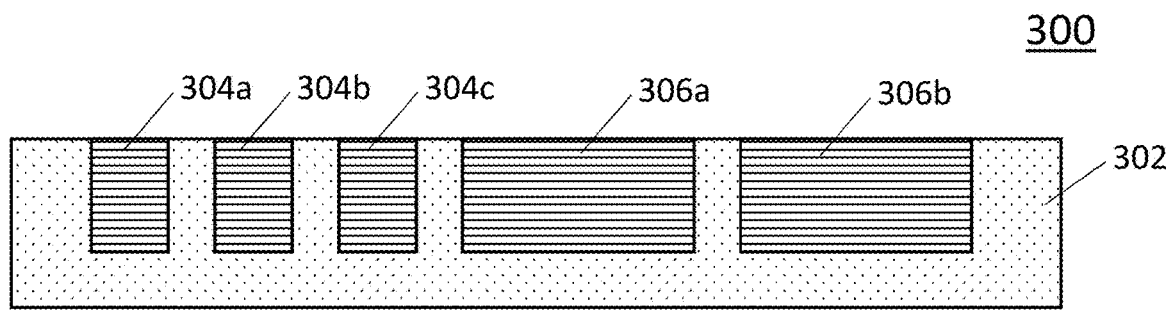
FIG. 3 is a cross-sectional illustration showing a portion of a semiconductor wafer at step 202 of the operational flow diagram of FIG. 2.
Figure 4:
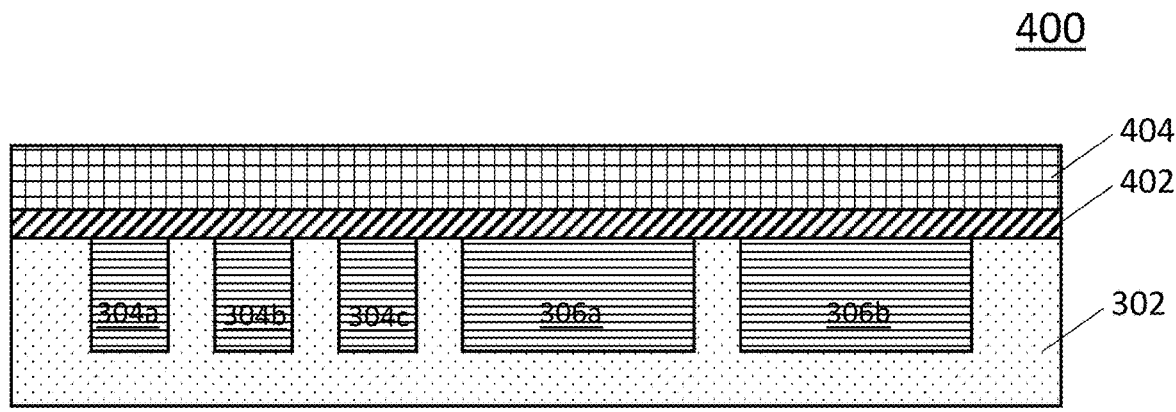
FIG. 4 is a cross-sectional illustration showing a portion of a semiconductor wafer at step 204 of the operational flow diagram of FIG. 2.

The process begins, at step 202, by providing a starting semiconductor wafer 300 at a post manufacturing chemical mechanical planarization stage such that the top surface of the wafer 300 is flat across the dielectric insulator 302 (e.g., $SiO_2$) and both narrow copper wires 304a, 304b, 304c and wide copper wires 306a, 306b, as shown in FIG. 3. At step 204, an optical pass through layer 402 and a photo-resist layer 404 are deposited over the polished semiconductor wafer 300, as shown in FIG. 4. The optical pass through layer 402 may be formed from any material that satisfies the thickness and optical requirements. Nitrides, such as silicon nitride (SiN), make suitable materials for the optical pass through layer 402, so the optical pass through layer 402 is referenced as "nitride layer 402" herein. Other suitable materials include polymer, nitride or oxide materials having desirable refractive index and etch properties. Although not shown, it should be noted that copper metallization also includes some liner and barrier materials, such as Co, Ru, Ta, TaN or any of those combination of materials, around the outside perimeter of the copper that act as diffusion barriers and adhesion layers.

Figure 5:
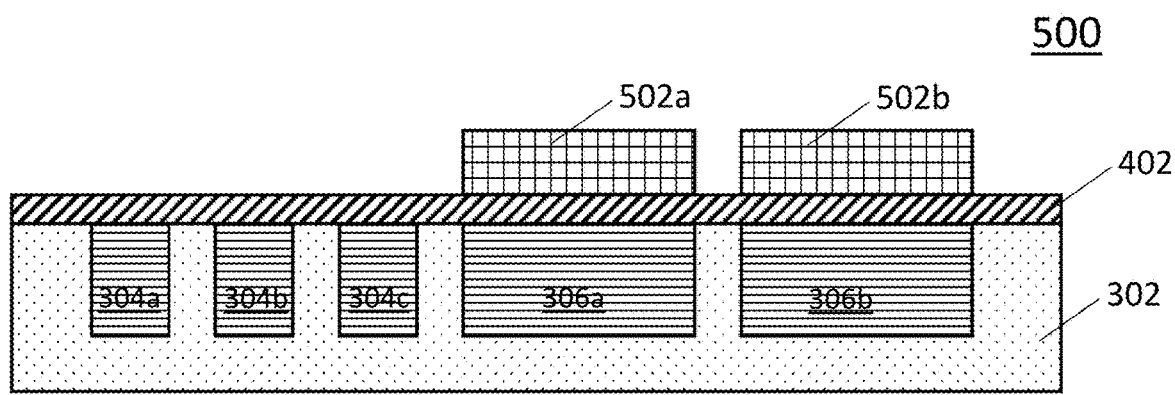
FIG. 5 is a cross-sectional illustration showing a portion of a semiconductor wafer at step 206 of the operational flow diagram of FIG. 2.

At step 206, the semiconductor wafer 400 comprising the nitride layer 402 and the photo-resist layer 404 is exposed to a light source. The light source may be a single wavelength source, or a broadband light flood exposure. The light source may emit ultraviolet (UV) light. By tuning the thickness of the nitride layer 402 correctly during the design of the wafer 400, only the regions where photo-resist 502a, 502b is above the wide copper wires 306a, 306b will maintain the resist, as shown in FIG. 5.

Figure 6:
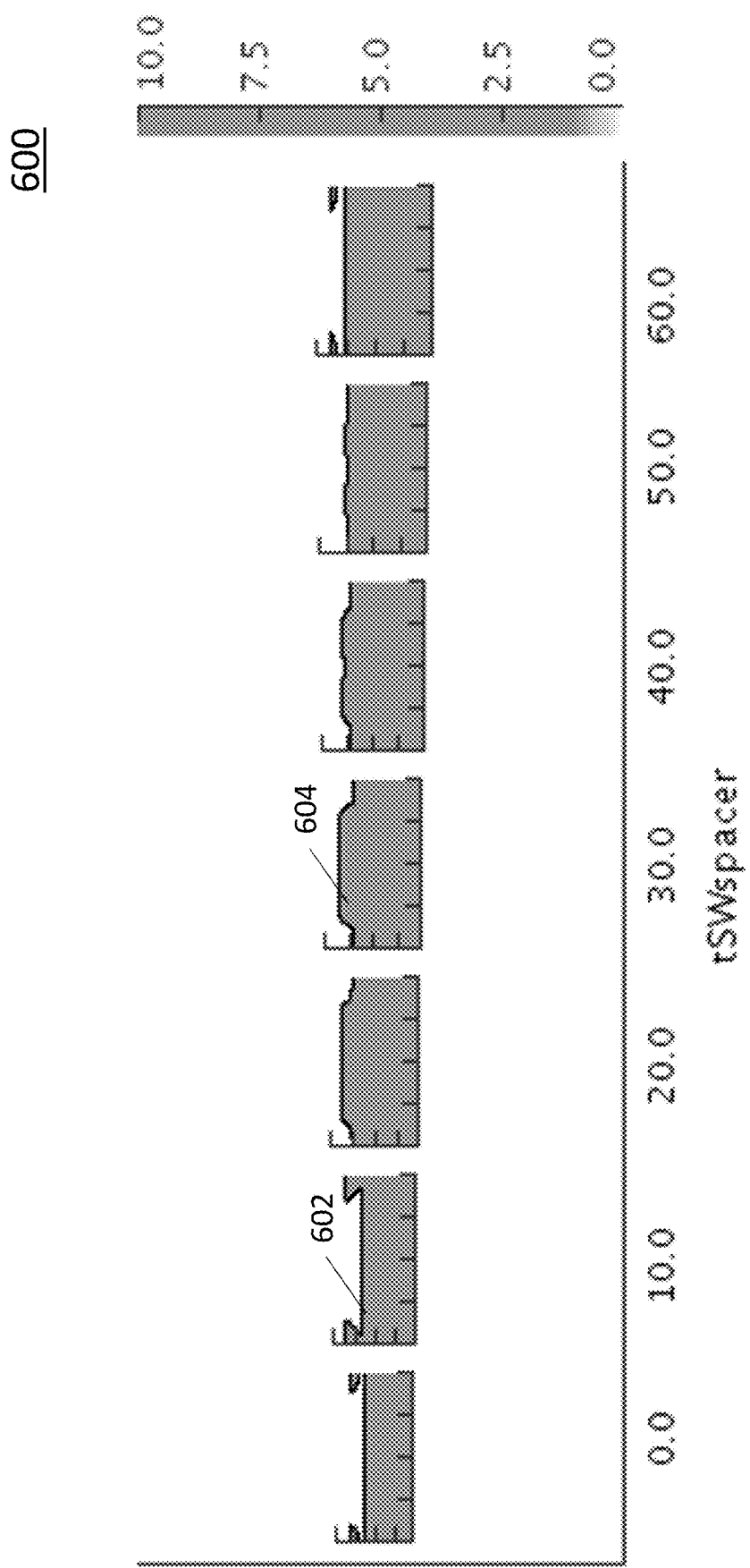
FIG. 6 is a diagram illustrating how the thickness of an example optical pass through layer affects the photo-resist.

The nitride thickness is tuned by altering the nitride deposition time. FIG. 6 is an illustration 600 depicting how the thickness of an example nitride layer 402 affects the photo-resist. Depending on the thickness of the nitride layer 402 either an opening or a block shape forms in the photo-resist. In FIG. 6, for a nitride layer thickness of 10 nm, an opening is formed in the resist 602, but for a nitride layer thickness of 30 nm, a block shape forms in the resist 604.

The light penetrates the resist 404 and nitride layers 402 into the copper wires 304a, 304b, 304c and 306a, 306b underneath. If the wires are very small (e.g., less than half the wavelength of the incoming light), the light will essentially be absorbed through the copper; however, if the wires are wide (e.g., greater than half the wavelength of the incoming light) the light will be self-reflected back into the photo-resist where they can interact. In the case where a negative tone photo-resist is used, wherever light is being exposed over the top of the wider wires 306a, 306b is where the photo-resist will remain. Additionally, light is absorbed in areas directly covering the dielectric insulator 302, thereby removing the resist covering these areas too. The reverse effect occurs when a positive tone photo-resist is used (i.e. photo-resist is removed over areas above the narrower wires 304a, 304b, 304c). These areas of remaining photo-resist 502a, 502b form a self-aligned pattern that create a shield over each wide copper wires 306a, 306b which protects the wide copper wires 306a, 306b.

Figure 7:
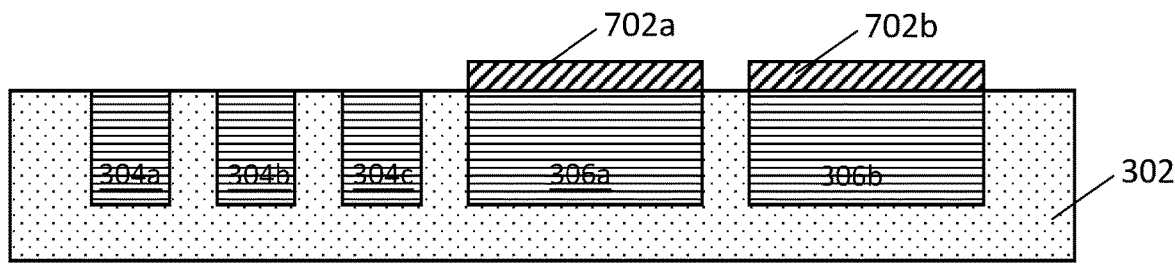
FIG. 7 is a cross-sectional illustration showing a portion of a semiconductor wafer at steps 208 and 210 of the operational flow diagram of FIG. 2.

At step 208, the resist pattern (in other words, the pattern formed by the remaining photo-resist 502a, 502b) is transferred to the nitride layer 402, revealing the narrow copper wires 304a, 304b, 304c. The remaining photo-resist 502a, 502b is stripped, at step 210, leaving areas of nitride 702a, 702b protecting the wide copper wires 306a, 306b from the upcoming alternative metallization process, as shown in FIG. 7.

Figure 8:
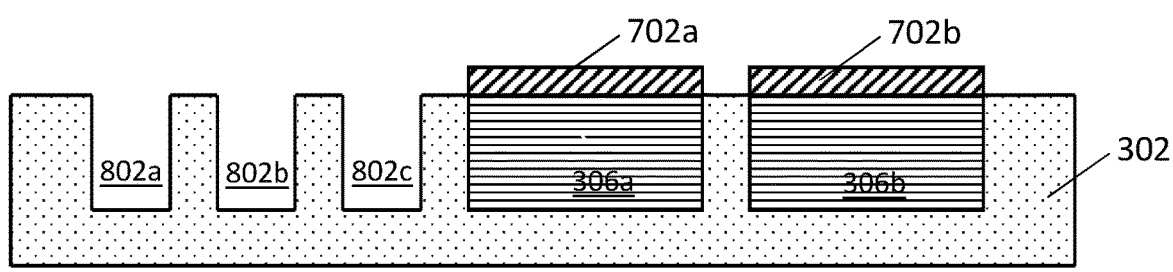
FIG. 8 is a cross-sectional illustration showing a portion of a semiconductor wafer at step 212 of the operational flow diagram of FIG. 2.

At step 212, the wafer 700 is chemically etched to only remove the narrow copper wires 304a, 304b, 304c, leaving a skeletal wafer 800 having gaps 802a, 802b, 802c in the dielectric insulator 302 where the narrow copper wires once were, as shown in FIG. 8. The chemical etching compound used to remove the narrow copper wires is selective to copper so that it will not affect the dielectric insulator 302 or the silicon nitride shields 702a, 702b.

Figure 9:
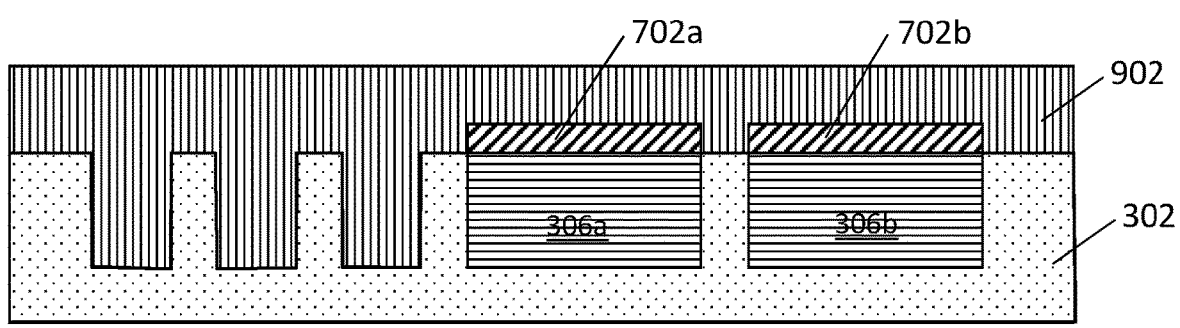
FIG. 9 is a cross-sectional illustration showing a portion of a semiconductor wafer at step 214 of the operational flow diagram of FIG. 2.
Figure 10:
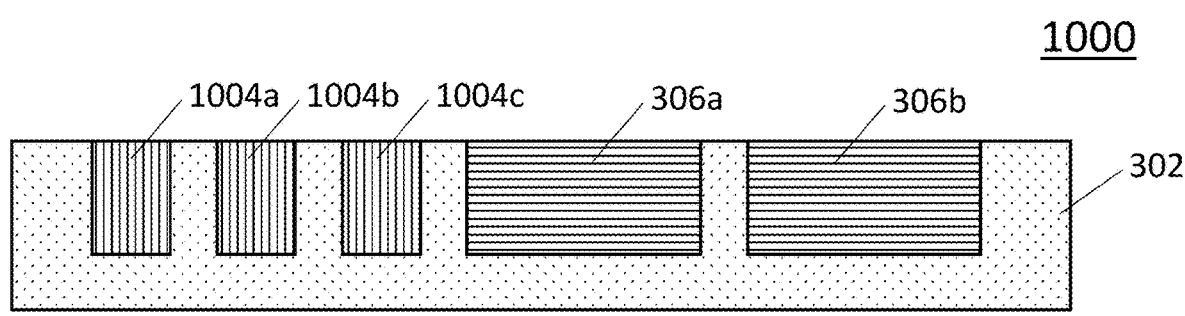
FIG. 10 is a cross-sectional illustration showing a portion of a semiconductor wafer at step 216 of the operational flow diagram of FIG. 2.

At step 214, the wafer 800 is metallized using an alternative metal, such as ruthenium (Ru), cobalt (Co), nickel (Ni), iridium (IR), rhodium (Rh), tungsten (W), titanium (Ti), titanium nitride (TiN), platinum (Pt), silver (Ag). etc., as shown in FIG. 9. The alternative metal layer 902 fills in the gaps 802a, 802b, 802c in the dielectric insulator 302. At step 216, the wafer 900 is again chemical metal polished to remove the excess metallization and remaining silicon nitride, leaving a smooth top surface and a wafer 900 having narrow non-copper metallic wires 1004a, 1004b, 1004c which have a low resistance and wide copper wires 306a, 306b having a higher resistance than the alternate metal, as shown in FIG. 10.

It should be noted that the process described above may also be performed by in a "reverse order" such that the original starting semiconductor wafer contains narrow non-copper wires and wide non-copper wires. The process is executed as described above, however, when the wafer is exposed to the light source, the photo-resist above the narrow non-copper wires remains and all other resist is removed. The non-copper metal forming wide wires is removed by etching and the metallization step uses copper to fill the exposed wide gaps.

The self-reflection cutoff for dense pitch image has been found to be dependent upon the illumination wavelength. Thus, the cutoff pitch is less than $\lambda/(2*n_{resist})$ where $n_{resist}$ is the resistance of the material the light penetrates. The cutoff pitch may be adjusted by varying the incoming illumination wavelength. Currently, a typical collimated immersion flood exposure has a 193 nm wavelength. As the resistance of the photo-resist is about 1.7, the current cutoff is about 193/(2*1.7), or roughly 50 nm. So, the photo resist remains after exposure for widths greater than 50 nm, but is removed for widths less than 50 nm.

Non-Limiting Embodiments

It should be noted that some features of the present invention may be used in an embodiment thereof without use of other features of the present invention. As such, the foregoing description should be considered as merely illustrative of the principles, teachings, examples, and exemplary embodiments of the present invention, and not a limitation thereof.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others.

The circuit as described above is part of the design for an integrated circuit chip. The chip design is created in a graphical computer programming language and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as discussed above are used in the fabrication of integrated circuit chips. The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products (such as, but not limited to, an information processing system) having a display, a keyboard, or other input device, and a central processor.

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The terms "a" or "an", as used herein, are defined as one as or more than one. The term plurality, as used herein, is defined as two as or more than two. Plural and singular terms are the same unless expressly stated otherwise. The term another, as used herein, is defined as at least a second or more. The terms including and/or having, as used herein, are defined as comprising (i.e., open language). The term coupled, as used herein, is defined as connected, although not necessarily directly, and not necessarily mechanically. The terms program, software application, and the like as used herein, are defined as a sequence of instructions designed for execution on a computer system. A program, computer program, or software application may include a subroutine, a function, a procedure, an object method, an object implementation, an executable application, an applet, a servlet, a source code, an object code, a shared library/ dynamic load library and/or other sequence of instructions designed for execution on a computer system.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed:

1. A method for fabricating semiconductor wafers, comprising:
   creating a semiconductor wafer having a plurality of wide copper wires and a plurality of narrow copper wires embedded in a dielectric insulator, each wide copper wire having a width greater than a width of each narrow copper wire;
   depositing an optical pass through layer over a top surface of the semiconductor wafer and a photo-resist layer over the optical pass through layer;
   exposing the semiconductor wafer to a light source to selectively remove photo-resist forming a self-aligned pattern where photo-resist only remains in areas above wide copper wires;
   transferring the self-aligned pattern to the optical pass through layer;
   removing the remaining photo-resist;
   chemical etching the semiconductor wafer to remove the plurality of narrow copper wires and define narrow gaps in the dielectric insulator; and
   metallizing the semiconductor wafer with a non-copper metal to form narrow non-copper metal wires in the narrow gaps.

2. The method of claim 1, further comprising chemical metal polishing the semiconductor wafer to remove excess non-copper metal and the optical pass through layer.

3. The method of claim 1, wherein the non-copper metal is one of ruthenium, cobalt, nickel, iridium, rhodium, tungsten, titanium, titanium nitride, platinum or silver.

4. The method of claim 1, wherein the light source uses ultraviolet light.

5. The method of claim 1, wherein the width of each narrow copper wire is less than 50 nm.

6. The method of claim 1, wherein the width of each narrow copper wire is less than 20 nm.

7. The method of claim 1, wherein the width of each narrow copper wire is less than half of the wavelength of the light source.

8. The method of claim 1, wherein the width of each narrow copper wire is less than half of the wavelength of the light source divided by twice the resistance of the optical pass through layer.

9. The method of claim 1, wherein the semiconductor wafer further comprises a barrier material surrounding each wide copper wire and each narrow copper wire.

10. The method of claim 9, wherein the barrier material is selected from the group consisting of cobalt, ruthenium, tantalum, tantalum nitride, or any combination thereof.

11. The method of claim 1, wherein the chemical etching uses a chemical etching compound selective to copper.

12. The method of claim 1, further comprising tuning a thickness of the optical pass through layer.

13. The method of claim 1, wherein the light source is a broadband light source.

14. The method of claim 1, wherein the light source is a single wavelength light source.

15. The method of claim 1, wherein the photo-resist is a negative tone photo-resist.

16. The method of claim 1, wherein the optical pass through layer comprises nitride.

17. A method for fabricating semiconductor wafers, comprising:
- creating a semiconductor wafer having a plurality of wide non-copper metal wires and a plurality of narrow non-copper metal wires embedded in a dielectric insulator, each wide non-copper metal wire having a width greater than a width of each narrow copper wire;
- depositing a nitride layer over a top surface of the semiconductor wafer and a photo-resist layer over the optical pass through layer;
- exposing the semiconductor wafer to a light source to selectively remove photo-resist forming a self-aligned pattern where photo-resist only remains in areas above narrow non-copper metal wires;
- transferring the self-aligned pattern to the optical pass through layer;
- removing the remaining photo-resist;
- chemical etching the semiconductor wafer to remove the plurality of wide non-copper metal wires and define wide gaps in the dielectric insulator; and
- metallizing the semiconductor wafer with a copper metal to form wide copper metal wires in the wide gaps.

18. The method of claim 17, wherein the width of each narrow copper wire is less than half of the wavelength of the light source.

19. The method of claim 17, wherein the photo-resist is a positive tone photo-resist.

20. The method of claim 17, wherein the width of each narrow copper wire is less than half of the wavelength of the light source divided by twice the resistance of the optical pass through layer.

* * * * *